United States Patent
Siegel (10) Patent No.: US 6,785,137 B2
(45) Date of Patent: Aug. 31, 2004

(54) METHOD AND SYSTEM FOR REMOVING HEAT FROM AN ACTIVE AREA OF AN INTEGRATED CIRCUIT DEVICE

(75) Inventor: Harry Michael Siegel, Hurst, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/205,715

(22) Filed: Jul. 26, 2002

(65) Prior Publication Data
US 2004/0017661 A1 Jan. 29, 2004

(51) Int. Cl.[7] .................................................. H05K 7/20
(52) U.S. Cl. ........................ 361/704; 361/710; 361/718; 165/80.2; 165/185; 257/707; 257/713; 257/719
(58) Field of Search ................ 160/80.2, 80.3, 160/185; 174/16.3; 257/675, 706–713, 718–719, 726–727; 361/690, 706–710, 714–723, 813

(56) References Cited

U.S. PATENT DOCUMENTS

| | | | | | |
|---|---|---|---|---|---|
| 4,709,301 A | * | 11/1987 | Yamaguti | ..................... | 361/704 |
| 4,855,869 A | * | 8/1989 | Tsuji | .......................... | 361/704 |
| 5,177,669 A | * | 1/1993 | Juskey et al. | ................ | 361/704 |
| 5,177,689 A | * | 1/1993 | Kinasi et al. | ................ | 361/704 |
| 6,373,703 B2 | * | 4/2002 | Johnson et al. | ............. | 361/704 |
| 6,381,136 B1 | * | 4/2002 | Nelson et al. | .............. | 361/704 |

* cited by examiner

Primary Examiner—Gregory D Thompson
(74) Attorney, Agent, or Firm—Lisa K. Jorgenson; William A. Munck (57) ABSTRACT

A method for removing heat from an active area of an integrated circuit device is provided. The method includes applying a separator to the active area of the integrated circuit device. A thermally conductive element is coupled to the active area of the integrated circuit device outwardly of the separator.

20 Claims, 5 Drawing Sheets

FIG. 12

METHOD AND SYSTEM FOR REMOVING HEAT FROM AN ACTIVE AREA OF AN INTEGRATED CIRCUIT DEVICE

TECHNICAL FIELD OF THE INVENTION

The present invention is directed in general to integrated circuits and, more specifically, to a method and system for removing heat from an active area of an integrated circuit device.

BACKGROUND OF THE INVENTION

A conventional integrated circuit package generally comprises an integrated circuit made of silicon, a laminate or leadframe substrate which provides support for and electrical interconnection to the integrated circuit (IC), and a protective material to protect the electrical connections between the integrated circuit and the substrate. During the manufacture of an integrated circuit package, the integrated circuit portion is generally referred to as a die.

The typical die is constructed such that the active electrical circuitry is located on one side of the die and occupies only the top few microns of its thickness. Thus, essentially all heat associated with operation of the IC is generated locally at the die surface. For normal semiconductor devices, the dice are made from Silicon (Si) or Germanium (Ge). Both of these materials are relatively poor thermal conductors with Germanium being the worst of the two.

To extract the heat generated at the surface of the die there are two possible conduction paths: (1) through the bulk material of the die (either Si or Ge) and thence connecting to other thermally conducting elements or (2) from the die through the encapsulating or "protecting" material surrounding the die (as described above).

Typically, the conduction path (1) is inefficient since the heat must traverse the bulk of the die (Si or Ge) and thence to other conducting elements. For this thermal conduction path, the thermal resistance encountered in traversing the bulk of the die is added to the thermal resistance of other elements in the conductive path, making it a less efficient path.

In conventional IC packages, the conduction path (2) is inefficient since the relatively thick protective material encasing the surface of the die is a thermosetting organic material, such as epoxy novolac resin, which has very poor thermal conductive properties. Thus, even though this path avoids traversing the bulk material of the die, it is rendered inefficient because of a relatively long thermal conduction path through a poorly conducting medium.

Because of the importance of removing heat from packaged semiconductor devices, many methods have been developed in attempts to improve this process. These methods typically include a thermally conductive element coupled to the outside of the package, i.e., not in direct or close contact with the active surface of the integrated circuit die. The thermally conductive element is used to conduct heat away from the semiconductor device.

As the heat is conducted away from the semiconductor device, the heat traverses a conductive path, which suffers resistance to the heat flow. This resistance to thermal conduction is a function of both the thermal conductivity of each element along the path and the distance the heat must travel through each of these elements. Thus, to remove heat, current solutions have included using materials with superior thermal conductivity in the extraction path and/or modifying designs to package geometry to minimize the length of the path.

However, as device scales become smaller and operating speeds become higher in integrated circuits, more power is generated and needs to be removed from the semiconductor devices to ensure a reasonable useful life span for the semiconductor devices. This is especially the case for the microprocessor family of digital integrated circuits. In these applications, currently available methods for removing heat may be insufficient.

SUMMARY OF THE INVENTION

In accordance with the present invention, a method and system for removing heat from an active area of an integrated circuit device are provided that substantially eliminate or reduce disadvantages and problems associated with conventional systems and methods. In particular, a thermally conductive element is coupled to the active area of the integrated circuit device, resulting in a minimized thermal conduction path and corresponding increase in efficiency of heat removal.

According to one embodiment of the present invention, a method for removing heat from an active area of an integrated circuit device is provided. The method includes applying a separator to the active area of the integrated circuit device. A thermally conductive element is coupled to the active area of the integrated circuit device outwardly of the separator.

According to another embodiment of the present invention, a system for removing heat from an active area of an integrated circuit device is provided that includes a separator and a thermally conductive element. The separator is coupled to the active area of the integrated circuit device. The thermally conductive element is coupled to the active area of the integrated circuit device outwardly of the separator.

Technical advantages of one or more embodiments of the present invention include providing an improved method for removing heat from an integrated circuit device. In a particular embodiment, a thermally conductive element is coupled to the active area of the integrated circuit device. As a result, the thermal conduction path from the active area of the integrated circuit device to the thermally conductive element is minimized. Accordingly, the efficiency of heat removal from the active area is increased.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 12, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit device.

Figure 1:
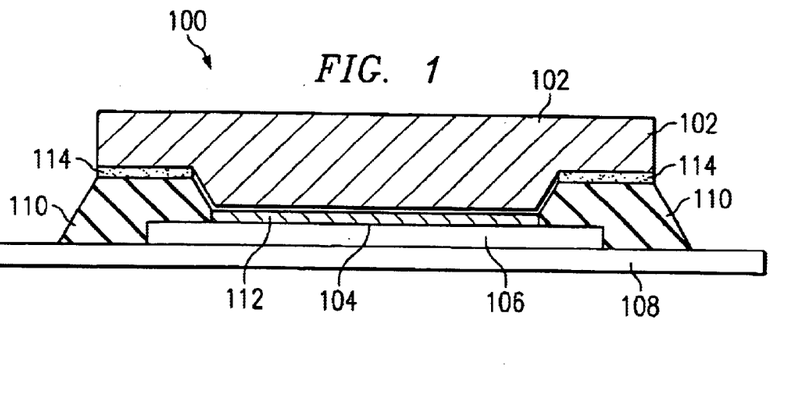
FIG. 1 is a schematic cross-sectional diagram illustrating a package structure comprising a thermally conductive element operable to remove heat from an active area of an integrated circuit device in accordance with a first embodiment of the present invention.

FIG. 1 is a schematic cross-sectional diagram illustrating a package structure 100 comprising a thermally conductive element 102 operable to remove heat from an active area 104 of an integrated circuit device 106 in accordance with one embodiment of the present invention. For this embodiment, the package structure 100 comprises a ball grid or land grid array package structure.

The thermally conductive element 102 is operable to dissipate heat from the integrated circuit device 106. Thus, the thermally conductive element 102 may comprise a heat sink, a heat spreader, or the like. According to one embodiment, the thermally conductive element 102 comprises copper. However, it will be understood that the thermally conductive element 102 may comprise any suitable thermally conductive material without departing from the scope of the present invention. In addition, the thermally conductive element 102 may comprise a passive element, acting as a conduit for heat conduction, or an active element, such as by incorporating a fan, by comprising channels, pipes, or the like for liquid cooling, by comprising thermoelectric cooling components, or by using any other components operable to remove heat actively.

The integrated circuit device 106 may comprise a microprocessor, a microcontroller, a memory device, an application-specific integrated circuit, or any other suitable device. The device 106, which may comprise silicon or other suitable material, is operable to function in an environment in which heat dissipation requirements are increased as compared with typical chip applications, as well as in a typical environment. The device 106 has a portion of its active area 104 exposed, which may be accomplished using the method of U.S. Pat. No. 5,800,841, U.S. Pat. No. 5,987,338, or any other suitable method.

In addition to the thermally conductive element 102 and the integrated circuit device 106, the package structure 100 comprises a substrate 108, a molded section 110, a thermally conductive film 112, and an adhesive 114. The substrate 108 is coupled to the integrated circuit device 106 and is operable to couple the integrated circuit device 106 to another element, such as a printed circuit board (not shown in FIG. 1).

The substrate 108 may comprise a fiberglass material or other suitable material. The molded section 110 is operable to cover a portion of the integrated circuit device 106, as well as any bonding wires or bonding fingers, thereby protecting the electrical connections between the integrated circuit device 106 and the substrate 108. The molded section 110 may comprise any suitable electrically insulating material, such as Nitto Denko HC-100-XJAA Molding Compound or the like.

The thermally conductive film 112 is operable to protect the active area 104 of the integrated circuit device 106 from mechanical contact with the thermally conductive element 102 while providing a thermally conductive path to the thermally conductive element 106. The thermally conductive film 112 may be applied either to the active area 104 or to the thermally conductive element 102 before the thermally conductive element 102 is attached to the package structure 100. The thermally conductive film 112 may comprise a tape or film comprising Aavid Thermalloy A-Dux or other suitable thermally conductive material.

The adhesive 114 is operable to couple the thermally conductive element 102 to the molded section 110 of the package structure 100. The adhesive 114 may comprise Locktite/Hysol E90FL or other suitable material operable to securely couple the thermally conductive element 102 to the package structure 100.

In operation, when the active area 104 of the integrated circuit device 106 is in use, heat is dissipated through the thermally conductive film 112 and the thermally conductive element 102. Thus, in this way, the heat generated by the active area 104 does not have to traverse the integrated circuit device 106 to be dissipated on the other side of the integrated circuit device 106.

Figure 2:
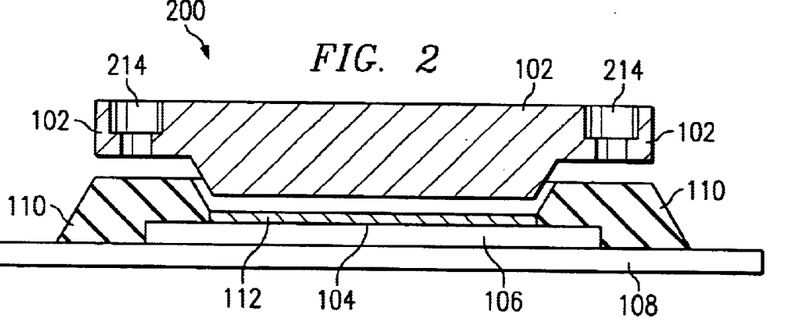
FIG. 2 is a schematic cross-sectional diagram illustrating a package structure comprising a thermally conductive element operable to remove heat from an active area of an integrated circuit device in accordance with a second embodiment of the present invention.

FIG. 2 is a schematic cross-sectional diagram illustrating a package structure 200 comprising a thermally conductive element 102 operable to remove heat from an active area 104 of an integrated circuit device 106 in accordance with one embodiment of the present invention. For this embodiment, the package structure 200 comprises a ball grid or land grid array package structure.

The package structure 200 is similar to the package structure 100 illustrated in FIG. 1. However, instead of comprising an adhesive 114, the package structure 200 comprises a plurality of openings 214 that are operable to couple the thermally conductive element 102 to the molded section 110 of the package structure 100. The openings 214 may be counter-bored to provide a recess for attaching hardware, such as clips, adhesive, and the like, in order to limit protrusion of any securing hardware above the surface of the thermally conductive element 102 and to minimize the height profile of the finished package structure 200. According to one embodiment, the package structure 200 comprises four openings 214; however, it will be understood that the package structure 200 may comprise any suitable number of openings 214 without departing from the scope of the present invention.

Figure 7A:
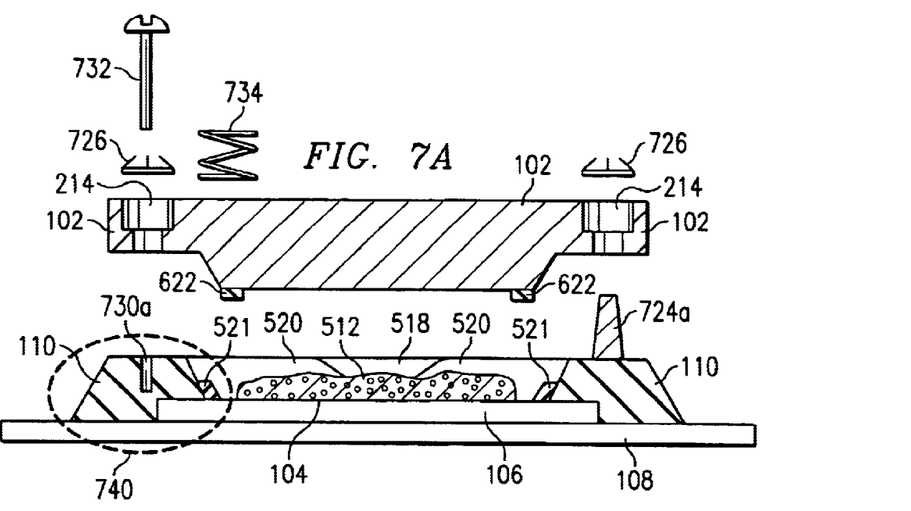
FIGS. 7A–E are a series of schematic cross-sectional diagrams illustrating alternate embodiments for coupling a thermally conductive element to an active area of an integrated circuit device.
Figure 7B:
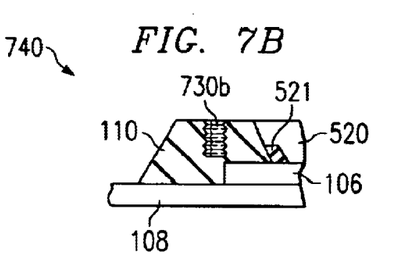
Figure 7C:
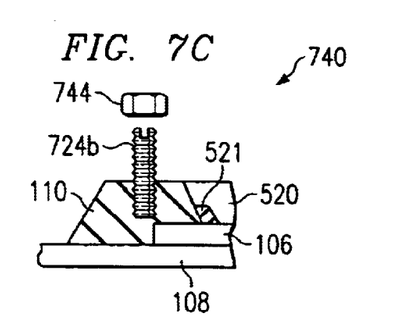
Figure 7D:
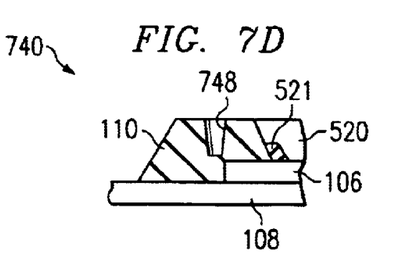
Figure 7E:
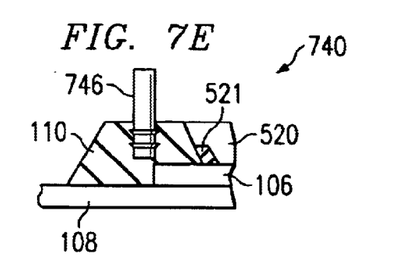

As described in more detail below in connection with FIG. 7, the openings 214 may fit securely over posts attached to the molded section 110 or may provide an area through which a screw or other connecting device may be inserted to be secured within the molded section 110.

Figure 3:
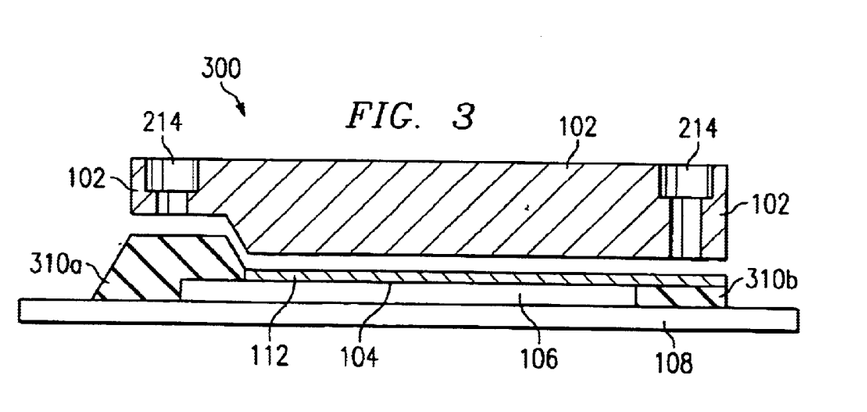
FIG. 3 is a schematic cross-sectional diagram illustrating a package structure comprising a thermally conductive element operable to remove heat from an active area of an integrated circuit device in accordance with a third embodiment of the present invention.

FIG. 3 is a schematic cross-sectional diagram illustrating a package structure 300 comprising a thermally conductive element 102 operable to remove heat from an active area 104 of an integrated circuit device 106 in accordance with one embodiment of the present invention. For this embodiment, the package structure 300 comprises a ball grid or land grid array package structure.

The package structure 300 is similar to the package structure 200 illustrated in FIG. 2. However, instead of the molded section 110 providing a uniform cavity in which to insert the thermally conductive element 102, the package structure 300 comprises a non-uniform molded section 310a–310b.

According to one embodiment, the molded section 310a–310b of the package structure 300 comprises one side 310a that is elevated with respect to the integrated circuit device 106 and three sides 310b that are essentially flush with the integrated circuit device 106. However, it will be understood that the molded section 310a–310b of the package structure 300 may comprise any suitable non-uniform geometry without departing from the scope of the present invention. For example, other embodiments may include, but are not limited to, the package structure 300 comprising (i) two sides 310a that are elevated with respect to the integrated circuit device 106 and two sides 310b that are essentially flush with the integrated circuit device 106, and (ii) three sides 310a that are elevated with respect to the integrated circuit device 106 and one side 310b that is essentially flush with the integrated circuit device 106.

In addition, although the illustrated embodiment comprises openings 214, it will be understood that the package structure 300 may also be implemented with an adhesive 114.

Figure 4:
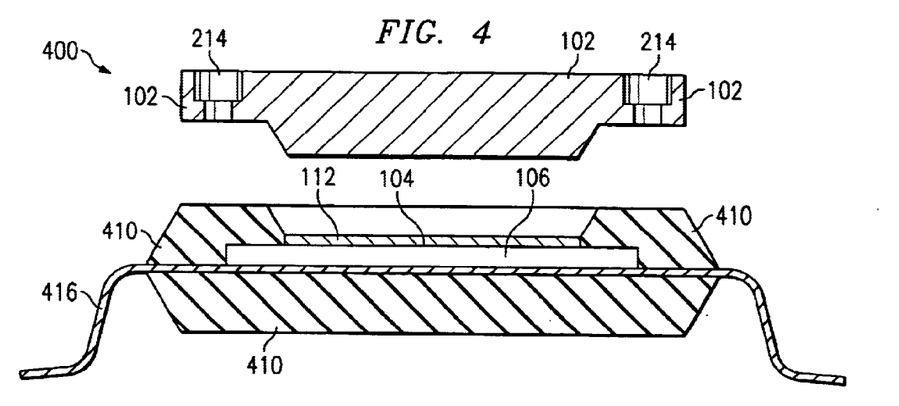
FIG. 4 is a schematic cross-sectional diagram illustrating a package structure comprising a thermally conductive element operable to remove heat from an active area of an integrated circuit device in accordance with a fourth embodiment of the present invention.

FIG. 4 is a schematic cross-sectional diagram illustrating a package structure 400 comprising a thermally conductive element 102 operable to remove heat from an active area 104 of an integrated circuit device 106 in accordance with one embodiment of the present invention. For this embodiment, the package structure 400 comprises a leadframe package structure.

Thus, the package structure 400 is similar to the package structure 200 illustrated in FIG. 2. However, instead of the comprising a substrate 108, the package structure 400 comprises a leadframe 416 comprising a plurality of leads, as well as a molded section 410 that surrounds the leadframe 416. Also, although the illustrated embodiment comprises openings 214, it will be understood that the package structure 400 may also be implemented with an adhesive 114.

Figure 5:
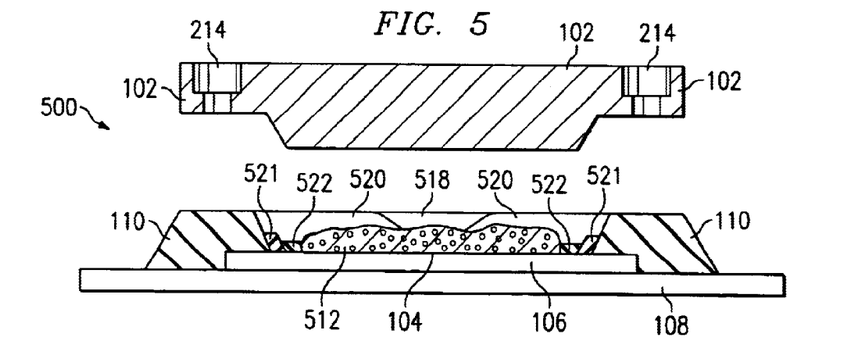
FIG. 5 is a schematic cross-sectional diagram illustrating a package structure comprising a thermally conductive element operable to remove heat from an active area of an integrated circuit device in accordance with a fifth embodiment of the present invention.

FIG. 5 is a schematic cross-sectional diagram illustrating a package structure 500 comprising a thermally conductive element 102 operable to remove heat from an active area 104 of an integrated circuit device 106 in accordance with one embodiment of the present invention. For this embodiment, the package structure 500 comprises a ball grid or land grid array package structure.

The package structure 500 is similar to the package structure 200 illustrated in FIG. 2. However, instead of comprising a thermally conductive film 112, the package structure 500 comprises a thermally conductive grease 512. The thermally conductive grease 512 is operable to protect the active area 104 of the integrated circuit device 106 from mechanical contact with the thermally conductive element 102 while providing a thermally conductive path to the thermally conductive element 106.

The thermally conductive grease 512 may comprise a grease or phase change material comprising Aavid Thermalloy ULTRASTICK phase change material, AOS Thermal Compounds AOS52032 Heat Sink Compound, or other suitable thermally conductive material. The package structure 500 may also comprise a pocket 518 in the side of the cavity 520 into which the thermally conductive element 102 is inserted in order to accommodate overflow of excess thermally conductive grease 512.

The package structure 500 may also comprise a shelf 521 and/or a spacer 522. The shelf 521 is operable to function as a mechanical stop between the thermally conductive element 102 and the active area 104 of the integrated circuit device 106 to prevent direct contact between these two components 102 and 104. According to the embodiment illustrated in FIG. 5, the spacer 522 is coupled to the active area 104 of the integrated circuit device 106. The spacer 522 is operable to provide a cushion between the thermally conductive element 102 and the active area 104 of the integrated circuit device 106. The spacer 522 is also operable to ensure that a relatively small separation between the thermally conductive element 102 and the thermally conductive grease 512 is maintained. The spacer 522 may comprise a polymer, paper, metal or other suitable material.

The thermally conductive grease 512 provides a thermally conductive path to the thermally conductive element 102, which is the next conductive element along the conductive path. The spacer 522 may be used to control the proximity of the thermally conductive element 102 to the active area 104 and prevent mechanical contact between these two components 102 and 104. So long as provisions (such as the pockets 518) are made to accommodate excess grease squeezed from between the two mating parts, i.e., the thermally conductive element 102 and the spacer 522, the thickness of the spacer 522 controls the thickness of the thermally conductive grease 512 and, therefore, the length of the conductive path through the thermally conductive grease 512. It is desirable to minimize this path by making the spacer 522 thin. If a tight fit between the thermally conductive element 102 and the cavity 520 is provided such that exudate from excess grease is restricted or prevented (and no overflow reservoirs such as pockets 518 are present in the molded section 110), hydrostatic pressure will develop in the thermally conductive grease 512 which will support the thermally conductive element 102 and prevent its contact with the delicate surface of the active area 104 without the need for spacer 522. However, for more accuracy in spacing the thermally conductive element 102 from the active area 104, the spacer 522 may be used.

In addition, although the illustrated embodiment comprises openings 214, it will be understood that the package structure 500 may also be implemented with an adhesive 114.

Figure 6:
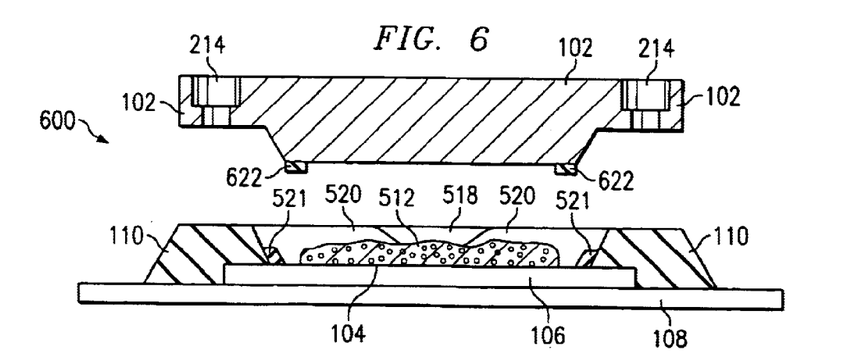
FIG. 6 is a schematic cross-sectional diagram illustrating a package structure comprising a thermally conductive element operable to remove heat from an active area of an integrated circuit device in accordance with a sixth embodiment of the present invention.

FIG. 6 is a schematic cross-sectional diagram illustrating a package structure 600 comprising a thermally conductive element 102 operable to remove heat from an active area 104 of an integrated circuit device 106 in accordance with one embodiment of the present invention. For this embodiment, the package structure 600 comprises a ball grid or land grid array package structure.

The package structure 600 is similar to the package structure 500 illustrated in FIG. 5. However, instead of comprising a spacer 522 that is coupled to the active area 104 of the integrated circuit device 106, the package structure 600 comprises a spacer 622 that is coupled to the thermally conductive element 102.

Although illustrated with both the shelf 521 and the spacer 622, it will be understood that the package structure 600 may comprise the shelf 521 and/or the spacer 622 without departing from the scope of the present invention. In addition, although the illustrated embodiment comprises openings 214, it will be understood that the package structure 600 may also be implemented with an adhesive 114.

FIGS. 7A–E are a series of schematic cross-sectional diagrams illustrating alternate embodiments for coupling a thermally conductive element 102 to an active area 104 of an integrated circuit device 106. FIGS. 7B–E depict a portion 740 of FIG. 7A in order to illustrate additional embodiments other than those shown in FIG. 7A.

The coupling embodiments include the use of a plurality of posts, or studs, 724a–724b that may be molded into the molded section 110 of the package structure or added during a post-molding procedure using threaded or unthreaded posts 724a–724b that may be inserted within holes 730a–730b in the molded section 110. The holes 730a–730b may be either molded or machined into the molded section 110. In addition, the holes 730a–730b may comprise either unthreaded holes 730a or threaded holes 730b. The threaded holes 730b may be formed by tapping or other suitable means. The posts 724a–724b are operable to fit securely within the openings 214 in the thermally conductive element 102, as described above in connection with FIG. 2.

Securing hardware such as spring clips 726 or adhesive (not shown in FIG. 7) may be used to secure the thermally conductive element 102 to unthreaded posts 724a, while securing hardware such as nuts or clips 744 may be used to secure the thermally conductive element 102 to threaded posts 724b. The spring clips 726 may be used alone or may be used together with other securing hardware in order to provide a compliant joint to accommodate dimensional changes in the assembled components due to differential thermal expansion of the components. Securing hardware may also comprise screws or bolts 732, springs 734, barbed posts 746 either press-fitted or secured with adhesive, threaded nuts 748, and any other suitable securing mechanisms, such as clips as described in more detail below.

Figure 8:
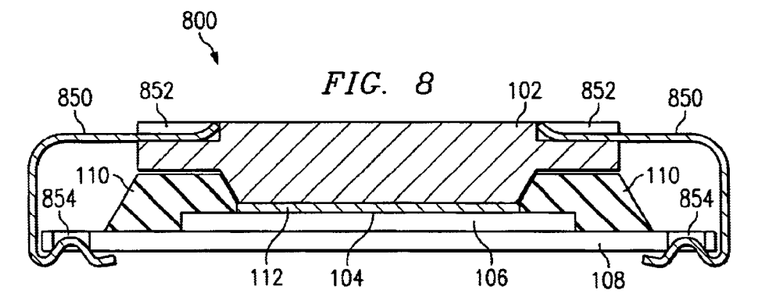
FIG. 8 is a schematic cross-sectional diagram illustrating a thermally conductive element coupled to an active area of an integrated circuit device in a ball grid array package using clips in accordance with one embodiment of the present invention.

FIG. 8 is a schematic cross-sectional diagram illustrating a thermally conductive element 102 coupled to an active area 104 of an integrated circuit device 106 in a ball grid array package structure 800 using clips 850 in accordance with one embodiment of the present invention.

The clips 850 may comprise metal, plastic, or other suitable material. The clips 850 may also comprise detents or curved sections to be able to be firmly attached to the package structure 800. The thermally conductive element 102 may comprise recesses 852 in order to receive the clips 850, and the substrate 108 comprises recesses 854 for receiving the clips 850. The package structure 800 may also comprise grooves or ridges to improve clip retention.

Figure 9:
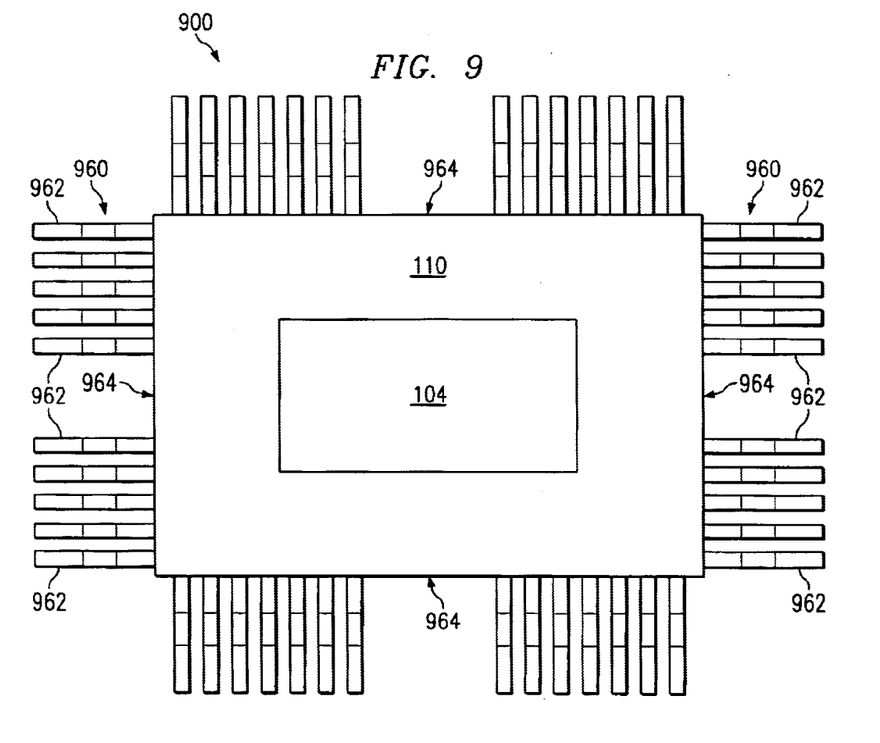
FIG. 9 is a schematic top-view diagram illustrating a leadframe package comprising an integrated circuit device operable to receive a thermally conductive element coupled to an active area of the integrated circuit device using clips.

FIG. 9 is a schematic top-view diagram illustrating a leadframe package 900 comprising an integrated circuit device operable to receive a thermally conductive element coupled to an active area 104 of the integrated circuit device using clips.

Figure 10:
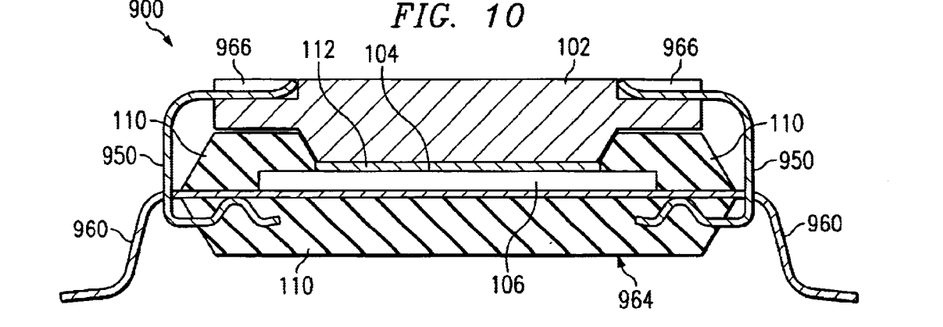
FIG. 10 is a schematic cross-sectional diagram illustrating a thermally conductive element coupled to the active area of the integrated circuit device of FIG. 9 in accordance with one embodiment of the present invention.

The leadframe package 900 comprises a leadframe 960 that comprises a plurality of leads 962. The leadframe package 900 also comprises a plurality of recesses 964 in a molded section 110 of the integrated circuit device in order to receive clips, as illustrated in FIG. 10. Although the illustrated embodiment comprises four recesses 964, it will be understood that the package structure 900 may comprise any suitable number of recesses 964 without departing from the scope of the present invention.

FIG. 10 is a schematic cross-sectional diagram illustrating a thermally conductive element 102 coupled to the active area 104 of the integrated circuit device 106 of the package structure 900 in accordance with one embodiment of the present invention.

The clips 950 may comprise metal, plastic, or other suitable material. The clips 950 may also comprise detents or curved sections to be able to be firmly attached to the package structure 900. The thermally conductive element 102 may comprise recesses 966 in order to receive the clips 950, and the molded section 110 comprises recesses 964 for receiving the clips 950. The package structure 900 may also comprise grooves or ridges to improve clip retention.

Figure 11:
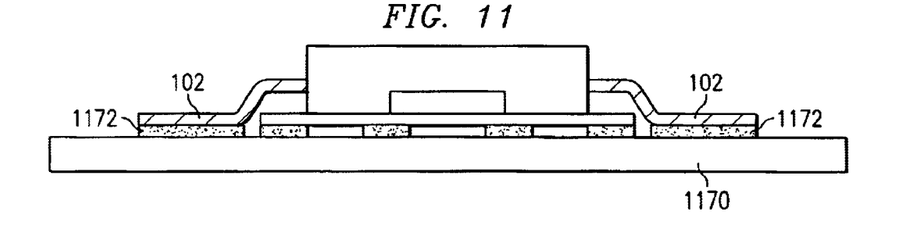
FIG. 11 is a schematic cross-sectional diagram illustrating a thermally conductive element coupled to an active area of an integrated circuit device and coupled to another device in accordance with one embodiment of the present invention.

FIG. 11 is a schematic cross-sectional diagram illustrating a thermally conductive element 102 coupled to an active area of an integrated circuit device and coupled to another device 1170 in accordance with one embodiment of the present invention. The thermally conductive element 102 comprises a wing configuration such that the thermally conductive element 102 may be coupled to the device 1170, in addition to the integrated circuit device, in order to improve the efficiency of heat removal from the integrated circuit device.

According to one embodiment, the device 1170 comprises a printed circuit board; however, it will be understood that the device 1170 may comprise any suitable device to which the integrated circuit device is coupled without departing from the scope of the present invention. The thermally conductive element 102 may be coupled to the device 1170 with an adhesive 1172 or by any other suitable means.

Figure 12:
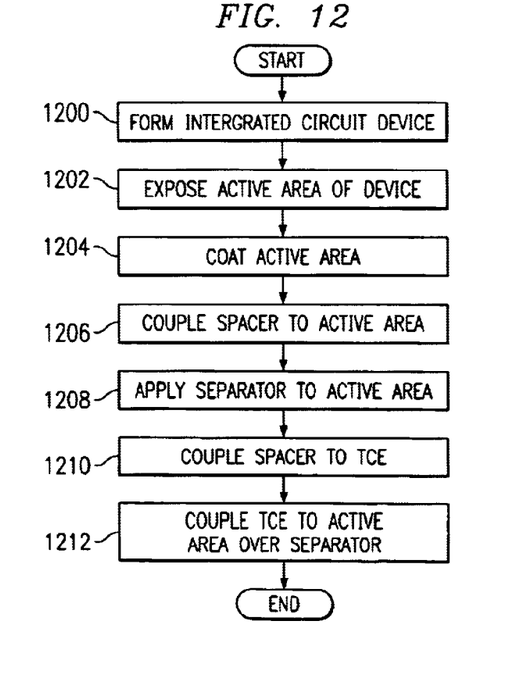
FIG. 12 is a flow diagram illustrating a method for removing heat from an active area of an integrated circuit device in accordance with one embodiment of the present invention.

FIG. 12 is a flow diagram illustrating a method for removing heat from an active area of an integrated circuit device in accordance with one embodiment of the present invention. The method begins at step 1200 where the integrated circuit device 106 is formed. At step 1202, an active area 104 of the integrated circuit device 106 is exposed. According to one embodiment, the active area 104 is exposed using the method of U.S. Pat. No. 5,800,841 or U.S. Pat. No. 5,987,338. However, it will be understood that any suitable method for exposing the active area 104 may be used without departing from the scope of the present invention.

At optional step 1204, the active area 104 may be coated with a thin organic film. At optional step 1206, a spacer 522 may be coupled to the active area 104. At step 1208, a separator, such as thermally conductive film 112, thermally conductive grease 512, or the like, is applied to the active area 104. At optional step 1210, a spacer 622 may be coupled to a thermally conductive element (TCE) 102. At step 1212, the thermally conductive element 102 is coupled to the active area 104 of the integrated circuit device 106 over the separator, at which point the method comes to an end. The thermally conductive element 102 may be coupled to the active area 104 using adhesive and/or any suitable securing hardware.

In this way, the thermal conduction path from the active area 104 of the integrated circuit device 106 to the thermally conductive element 102 is minimized. Accordingly, the efficiency of heat removal from the active area 104 is increased.

Although the present invention has been described with several embodiments, various changes and modifications may be suggested to one skilled in the art. It is intended that the present invention encompass such changes and modifications as fall within the scope of the appended claims.

What is claimed is:

1. A method for removing heat from an active area of an integrated circuit device, comprising:

applying a separator to the active area of the integrated circuit device;

coupling a thermally conductive element to the active area of the integrated circuit device outwardly of the separator; and coupling a spacer between the active area of the integrated circuit device and the thermally conductive element.

2. The method of claim 1, the separator comprising a thermally conductive film.

3. The method of claim 1, the separator comprising a thermally conductive grease.

4. The method of claim 1, coupling the spacer comprising coupling the spacer to the active area of the integrated circuit device prior to coupling the thermally conductive element to the active area.

5. The method of claim 1, coupling the spacer comprising coupling the spacer to the thermally conductive element prior to coupling the thermally conductive element to the active area.

6. The method of claim 1, coupling the thermally conductive element to the active area of the integrated circuit device comprising coupling the thermally conductive element to the active area with securing hardware.

7. A method for removing heat from an active area of an integrated circuit device, comprising:

forming an integrated circuit device;

exposing an active area of the integrated circuit device;

applying a separator to the active area of the integrated circuit device;

coupling a thermally conductive element to the active area of the integrated circuit device outwardly of the separator; and coupling a spacer between the active area of the integrated circuit device and the thermally conductive element.

8. The method of claim 7, further comprising coating the active area of the integrated circuit device with a thin organic film.

9. The method of claim 7, the separator comprising a thermally conductive film.

10. The method of claim 7, the separator comprising a thermally conductive grease.

11. The method of claim 7, coupling the spacer comprising coupling the spacer to the active area of the integrated circuit device prior to coupling the thermally conductive element to the active area.

12. The method of claim 7, coupling the spacer comprising coupling the spacer to the thermally conductive element prior to coupling the thermally conductive element to the active area.

13. The method of claim 7, coupling the thermally conductive element to the active area of the integrated circuit device comprising coupling the thermally conductive element to the active area with securing hardware.

14. A system for removing heat from an active area of an integrated circuit device, comprising:

a separator coupled to the active area of the integrated circuit device;

a thermally conductive element coupled to the active area of the integrated circuit device outwardly of the separator; and a spacer coupled between the active area of the integrated circuit device and the thermally conductive element.

15. The system of claim 14, the separator comprising a thermally conductive film.

16. The system of claim 14, the separator comprising a thermally conductive grease.

17. The system of claim 14, the spacer first coupled to the active area of the integrated circuit device.

18. The system of claim 14, the spacer first coupled to the thermally conductive element.

19. The system of claim 14, the thermally conductive element coupled to the active area of the integrated circuit device with securing hardware.

20. The system of claim 19, the securing hardware comprising at least one of spring clips, adhesive, nuts, clips, screws, bolts, springs and barbed posts.

* * * * *